(12) United States Patent
Han et al.

(10) Patent No.: US 8,930,794 B2
(45) Date of Patent: Jan. 6, 2015

(54) ERROR INJECTION FOR LDPC RETRY VALIDATION

(75) Inventors: Yang Han, Sunnyvale, CA (US); Shaohua Yang, San Jose, CA (US)

(73) Assignee: LSI Corporation, Milpitas, CA (US)

( * ) Notice: Subject to any disclaimer, the term of this patent is extended or adjusted under 35 U.S.C. 154(b) by 311 days.

(21) Appl. No.: 13/483,982

(22) Filed: May 30, 2012

(65) Prior Publication Data

US 2013/0326302 A1    Dec. 5, 2013

(51) Int. Cl.
*H03M 13/00*    (2006.01)
*G06F 11/00*    (2006.01)

(52) U.S. Cl.
USPC ............ 714/758; 714/703; 714/755; 375/262; 375/341

(58) Field of Classification Search
CPC ............ G11B 20/1813; G11B 20/1809; G11B 20/1816; G11B 20/1833; G11B 20/1866; H03M 13/3746; H03M 13/3707; H03M 13/37; H04L 1/005; H04L 1/004; H04L 1/0047; H04L 1/0048
USPC ......... 714/758, 752–755, 746, 748, 703, 701; 375/262, 341, 224
See application file for complete search history.

(56) References Cited

U.S. PATENT DOCUMENTS

| | | | |
|---|---|---|---|
| 5,701,314 A | 12/1997 | Armstrong | |
| 5,712,861 A | 1/1998 | Inoue | |
| 6,332,207 B1 * | 12/2001 | Southerland et al. | 714/763 |
| 6,438,717 B1 | 8/2002 | Butler | |
| 6,657,803 B1 | 12/2003 | Ling et al. | |
| 7,136,244 B1 | 11/2006 | Rothberg | |
| 7,702,989 B2 | 4/2010 | Graef et al. | |
| 7,730,384 B2 | 6/2010 | Graef et al. | |
| 7,738,201 B2 | 6/2010 | Jin et al. | |
| 7,747,922 B2 * | 6/2010 | Mielczarek et al. | 714/748 |
| 7,971,125 B2 | 6/2011 | Graef et al. | |
| 7,990,642 B2 | 8/2011 | Lee et al. | |
| 8,176,404 B2 | 5/2012 | Yang et al. | |
| 8,321,772 B1 * | 11/2012 | Yeung et al. | 714/795 |
| 2011/0080211 A1 | 4/2011 | Yang | |
| 2011/0161633 A1 | 6/2011 | Xu | |
| 2011/0231729 A1 * | 9/2011 | Paranjape | 714/752 |
| 2012/0200954 A1 | 8/2012 | Jin | |
| 2012/0236429 A1 | 9/2012 | Yang | |

OTHER PUBLICATIONS

Olmos et al., "Tree-Structure Expectation Propagation for LDPC Decoding in Erasure Channels", Cornell University Library arXiv:1009.4287 (Sep. 22, 2010).
U.S. Appl. No. 13/474,672, Unpublished (filed May 17, 2012) (Fan Zhang).

(Continued)

*Primary Examiner* — Christine Tu
(74) *Attorney, Agent, or Firm* — Hamilton DeSanctis & Cha

(57) ABSTRACT

The present inventions are related to systems and methods for validating retry features in LDPC decoders and in systems incorporating LDPC decoders. For example, a data processing circuit is disclosed that includes a low density parity check decoder and is operable to correct errors in a data set. The data processing circuit includes at least one retry feature operable to assist in correcting the errors that are not corrected without the at least one retry feature. A retry validation circuit in the data processing circuit is operable to inject errors in the data set to trigger the at least one retry feature.

20 Claims, 3 Drawing Sheets

(56) References Cited

OTHER PUBLICATIONS

U.S. Appl. No. 13/459,282, Unpublished (filed Apr. 30, 2012) (Fan Zhang).
U.S. Appl. No. 13/445,858, Unpublished (filed Apr. 12, 2012) (Johnson Yen).
U.S. Appl. No. 13/412,492, Unpublished (filed Mar. 5, 2012) (Shaohua Yang).
U.S. Appl. No. 13/326,367, Unpublished (filed Dec. 15, 2011) (Shaohua Yang).
U.S. Appl. No. 13/372,600, Unpublished (filed Feb. 14, 2012) (Shaohua Yang).
U.S. Appl. No. 13/326,363, Unpublished (filed Dec. 15, 2011) (Fan Zhang).
U.S. Appl. No. 13/465,214, Unpublished (filed May 7, 2012) (Chung-Li Wang).

* cited by examiner

ERROR INJECTION FOR LDPC RETRY VALIDATION

BACKGROUND

Various data processing systems have been developed including storage systems, cellular telephone systems, and radio transmission systems. In such systems data is transferred from a sender to a receiver via some medium. For example, in a storage system, data is sent from a sender (i.e., a write function) to a receiver (i.e., a read function) via a storage medium. As information is stored and transmitted in the form of digital data, errors are introduced that, if not corrected, can corrupt the data and render the information unusable. The effectiveness of any transfer is impacted by any losses in data caused by various factors. Many types of error checking systems have been developed to detect and correct errors in digital data. For example, in perhaps the simplest system, a parity bit can be added to a group of data bits, ensuring that the group of data bits (including the parity bit) has either an even or odd number of ones. When using odd parity, as the data is prepared for storage or transmission, the number of data bits in the group that are set to one are counted, and if there is an even number of ones in the group, the parity bit is set to one to ensure that the group has an odd number of ones. If there is an odd number of ones in the group, the parity bit is set to zero to ensure that the group has an odd number of ones. After the data is retrieved from storage or received from transmission, the parity can again be checked, and if the group has an even parity, at least one error has been introduced in the data. At this simplistic level, some errors can be detected but not corrected.

The parity bit may also be used in error correction systems, including in Low Density Parity Check (LDPC) decoders. An LDPC code is a parity-based code that can be visually represented in a Tanner graph 100 as illustrated in FIG. 1. In an LDPC decoder, multiple parity checks are performed in a number of check nodes 102, 104, 106 and 108 for a group of variable nodes 110, 112, 114, 116, 118, 120, 122, and 124. The connections (or edges) between variable nodes 110-124 and check nodes 102-108 are selected as the LDPC code is designed, balancing the strength of the code against the complexity of the decoder required to execute the LDPC code as data is obtained. The number and placement of parity bits in the group are selected as the LDPC code is designed. Messages are passed between connected variable nodes 110-124 and check nodes 102-108 in an iterative process, passing beliefs about the values that should appear in variable nodes 110-124 to connected check nodes 102-108. Parity checks are performed in the check nodes 102-108 based on the messages and the results are returned to connected variable nodes 110-124 to update the beliefs if necessary. LDPC decoders may be implemented in binary or non-binary fashion. In a binary LDPC decoder, variable nodes 110-124 contain scalar values based on a group of data and parity bits that are retrieved from a storage device, received by a transmission system or obtained in some other way. Messages in the binary LDPC decoders are scalar values transmitted as plain-likelihood probability values or log-likelihood-ratio (LLR) values representing the probability that the sending variable node contains a particular value. In a non-binary LDPC decoder, variable nodes 110-124 contain symbols from a Galois Field, a finite field $GF(p^k)$ that contains a finite number of elements, characterized by size $p^k$ where p is a prime number and k is a positive integer. Messages in the non-binary LDPC decoders are multi-dimensional vectors, generally either plain-likelihood probability vectors or LLR vectors.

The connections between variable nodes 110-124 and check nodes 102-108 may be presented in matrix form as follows, where columns represent variable nodes, rows represent check nodes, and a random non-zero element $a(i,j)$ from the Galois Field at the intersection of a variable node column and a check node row indicates a connection between that variable node and check node and provides a permutation for messages between that variable node and check node:

$$H = \begin{bmatrix} a(1,1) & 0 & 0 & a(1,2) & 0 & a(1,3) & a(1,4) & 0 \\ 0 & a(2,1) & 0 & 0 & a(2,2) & 0 & 0 & a(2,3) \\ a(3,1) & 0 & a(3,2) & 0 & a(3,3) & a(3,4) & 0 & a(3,5) \\ 0 & a(4,1) & 0 & a(4,2) & 0 & 0 & a(4,3) & a(4,4) \end{bmatrix}$$

By providing multiple check nodes 102-108 for the group of variable nodes 110-124, redundancy in error checking is provided, enabling errors to be corrected as well as detected. Each check node 102-108 performs a parity check on bits or symbols passed as messages from its neighboring (or connected) variable nodes. In the example LDPC code corresponding to the Tanner graph 100 of FIG. 1, check node 102 checks the parity of variable nodes 110, 116, 120 and 122. Values are passed back and forth between connected variable nodes 110-124 and check nodes 102-108 in an iterative process until the LDPC code converges on a value for the group of data and parity bits in the variable nodes 110-124. For example, variable node 110 passes messages to check nodes 102 and 106. Check node 102 passes messages back to variable nodes 110, 116, 120 and 122. The messages between variable nodes 110-124 and check nodes 102-108 are probabilities or beliefs, thus the LDPC decoding algorithm is also referred to as a belief propagation algorithm. Each message from a node represents the probability that a bit or symbol has a certain value based on the current value of the node and on previous messages to the node.

A message from a variable node to any particular neighboring check node is computed using any of a number of algorithms based on the current value of the variable node and the last messages to the variable node from neighboring check nodes, except that the last message from that particular check node is omitted from the calculation to prevent positive feedback. Similarly, a message from a check node to any particular neighboring variable node is computed based on the current value of the check node and the last messages to the check node from neighboring variable nodes, except that the last message from that particular variable node is omitted from the calculation to prevent positive feedback. As local decoding iterations are performed in the system, messages pass back and forth between variable nodes 110-124 and check nodes 102-108, with the values in the nodes 102-124 being adjusted based on the messages that are passed, until the values converge and stop changing or until processing is halted.

Some LDPC decoders or systems using an LDPC decoder include additional error correction features that are invoked if data fails to converge after normal decoding. Such retry features may, for example, repeat the decoding process after adjusting the input data values in an attempt to help the data converge in the LDPC decoder. However, testing such retry features can be difficult in an iterative data processing system such as an LDPC decoder.

BRIEF SUMMARY

The present inventions are related to systems and methods for validating retry features in LDPC decoders and in systems incorporating LDPC decoders. In some embodiments, a data processing circuit is disclosed that includes a LDPC decoder. The data processing circuit includes retry features that may be invoked if data fails to converge on correct values during normal operation. Examples of such retry features include, but are not limited to, targeted bit or symbol flipping, bit selective scaling (BSS), extrinsic LLR adjusting or parity forcing, dynamic vscaling in a detector, dynamic LDPC scaling/offset, etc.

Errors are injected in data to be processed such that the desired retry features will be triggered in the LDPC decoder, even if the error-injected data is pre-processed before decoding, for example by interleaving or by processing with a Viterbi detector. If the retry features being validated are working correctly, the processed output will be error-free, with the retry features having corrected the injected errors. Status indicators in the data processing circuit may also be used to determine whether the desired retry feature was triggered by the injected errors.

This summary provides only a general outline of some embodiments according to the present invention. Many other objects, features, advantages and other embodiments of the present invention will become more fully apparent from the following detailed description, the appended claims and the accompanying drawings.

BRIEF DESCRIPTION OF THE DRAWINGS

A further understanding of the various embodiments of the present invention may be realized by reference to the figures which are described in remaining portions of the specification.

DETAILED DESCRIPTION OF THE INVENTION

Figure 1:
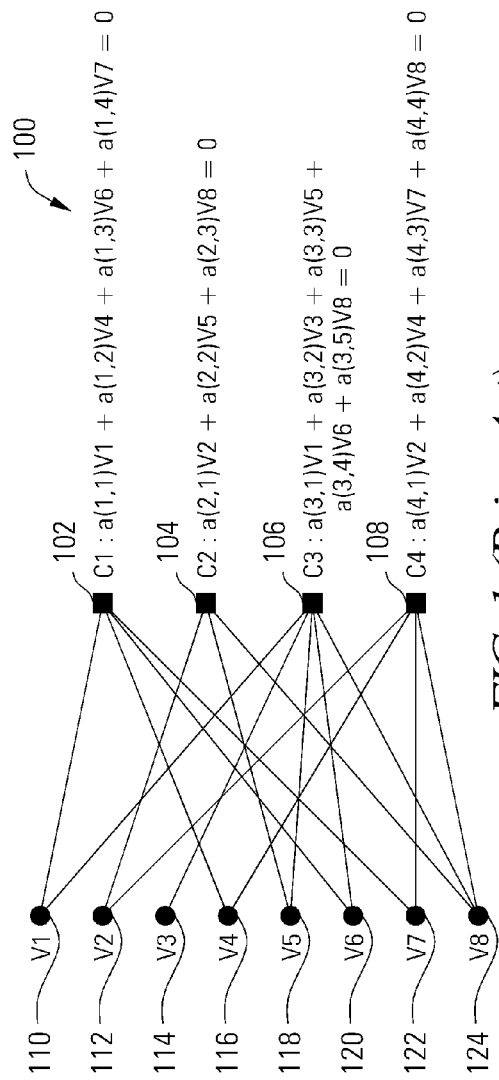
FIG. 1 depicts a Tanner graph of an example prior art LDPC code.

The present inventions are related to systems and methods for systems and methods for validating retry features in LDPC decoders and in systems incorporating LDPC decoders. The LDPC decoder used in various embodiments may be any type of LDPC decoder, including binary and non-binary, layered and non-layered. LDPC technology is applicable to transmission of information over virtually any channel or storage of information on virtually any media. Transmission applications include, but are not limited to, optical fiber, radio frequency channels, wired or wireless local area networks, digital subscriber line technologies, wireless cellular, Ethernet over any medium such as copper or optical fiber, cable channels such as cable television, and Earth-satellite communications. Storage applications include, but are not limited to, hard disk drives, compact disks, digital video disks, magnetic tapes and memory devices such as DRAM, NAND flash, NOR flash, other non-volatile memories and solid state drives.

Errors are injected in the system in such a way that the desired retry features will be triggered in the LDPC decoder, even if the error-injected data is pre-processed before decoding, for example by interleaving or by processing with a Viterbi detector. Errors are designed and injected to trigger the desired retry features, which may be targeted at soft errors. If the errors are not designed and injected properly, the errors may propagate in the LDPC decoder and result in a larger error or parity check failure which will not trigger the desired retry feature. For example, if the desired retry feature is targeted at soft errors, it may not be triggered in the LDPC decoder if an injected error is magnified during pre-processing or if it propagates in the LDPC decoder and causes more parity check failures than the desired retry feature is designed to handle.

Examples of retry features that may be invoked in an LDPC decoder or in a data processing system incorporating an LDPC decoder include, but are not limited to, targeted bit or symbol flipping, bit selective scaling (BSS), extrinsic LLR adjusting or parity forcing, dynamic vscaling in a detector, dynamic LDPC scaling/offset, etc.

The error injection for retry validation disclosed herein may be performed in a data processing system when designing the system, during manufacturing tests, or during test sequences in an operating system, for example during startup tests. In some embodiments, an error injection circuit is fabricated in an integrated circuit along with an LDPC decoder. In some instances of these embodiments, other devices are also included in the integrated circuit, such as a detector, memory, interleaver/deinterleaver, etc.

The errors injected for retry validation of an LDPC decoder are selected to correspond to trapping set locations in the LDPC code to prevent the data from converging despite the errors in the LDPC decoder. The errors are also selected to generate the number of parity check violations that will trigger the retry feature being validated. In other words, the injected errors are selected to result in a number of parity check violations that is numerous enough for the LDPC decoder or the overall system to invoke the retry feature being validated, but not so numerous that the LDPC decoder or the overall system invokes a different retry feature or simply reports a failure.

A trapping set in an LDPC code is a set of variable nodes that errors can be trapped in, so that they tend to resist converging to the correct data. The structure of a trapping set in an LDPC code is not limited to defined patterns, but can vary for a particular LDPC code or across different LDPC codes. LDPC codes are typically manually designed with care in an effort to avoid trapping sets and to increase the error detection and correction capabilities while reducing the number of parity bits needed to implement the code. Based upon the disclosure provided herein, one of ordinary skill in the art will recognize the techniques used both to design an LDPC code and to recognize patterns in the variable node and check node connections in the LDPC code that are prone to result in a trapping set. The errors to be injected into a system for LDPC retry validation are applied to variable node bits or symbols that are among those prone to result in a trapping set. The number of variable node bits or symbols selected for error injection may be based on the number of parity check violations needed to trigger the retry features being validated, as well as on the operational behavior of the LDPC decoder and of the overall system containing the LDPC decoder, such as the tendency for errors to propagate and magnify in the system. For example, the number of global iterations to be performed in a system containing an LDPC decoder and Viterbi detector, as well as the error correction characteristics of the LDPC decoder and Viterbi detector, will influence the number of errors that should be injected to result in a desired number of parity check violations that will trigger a retry feature being validated.

Figure 2:
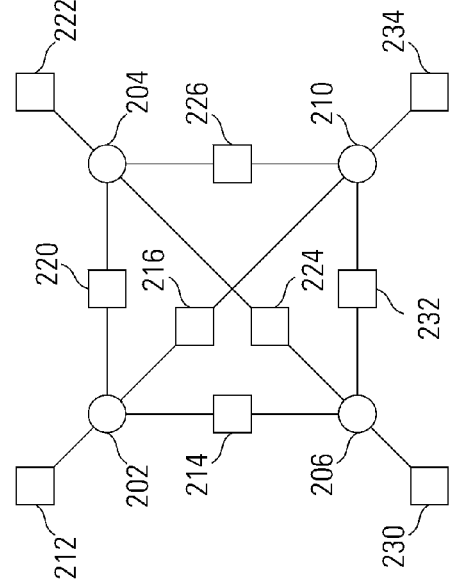
FIG. 2 depicts an example trapping set in an LDPC code.

Turning to FIG. 2, a simple trapping set 200 in an LDPC code is depicted as an example of the type of error that is injected into a system for LDPC retry validation. The example trapping set 200 includes four variable nodes 202, 204, 206 and 210. Variable node 202 is connected to four check nodes 212, 214, 216 and 220. Variable node 204 is connected to four check nodes 220, 222, 224 and 226. Variable node 206 is connected to four check nodes 214, 224, 230 and 232. Variable node 210 is connected to four check nodes 216, 226, 232 and 234.

Variable nodes 202, 204, 206 and 210 form a trapping set 200. If all four variable nodes 202, 204, 206 and 210 have errors in their bit or symbol values, these errors will tend to be trapped. The check nodes 214, 216, 220, 224, 226 and 232 that are connected only to variable nodes 202, 204, 206 and 210 within the trapping set 200, the parity checks performed by these check nodes 214, 216, 220, 224, 226 and 232 may pass even if the values in the variable nodes 202, 204, 206 and 210 are incorrect. For example, if both variable nodes 202 and 206 contain erroneous bit values of 0 instead of correct bit values of 1, the parity check performed in check node 214 will pass because both inputs from variable nodes 202 and 206 are incorrect. Similarly, if both variable nodes 202 and 210 contain incorrect values, the parity check performed in check node 216 will pass.

If majority rules voting or similar systems are used to reconcile the parity checks for a particular variable node in the trapping set 200, the error is trapped rather than corrected. For example, if check nodes 214, 224 and 232 all incorrectly report that variable node 206 contains the correct data value, the variable node 206 will maintain the incorrect data value, even if check node 230 reports that it is an error based on other variable nodes (not shown) that are connected to check node 230. In other words, even if the parity check performed in check node 230 fails because the error in variable node 206 does not combine with values from other variable nodes (not shown) connected to check node 230 to pass the parity check, the error report from check node 230 will be overruled by the mistaken reports from check nodes 214, 224 and 232 indicating that variable node 206 is correct.

Again, trapping set 200 is only an example, and one of ordinary skill in the art will recognize patterns an LDPC code that are prone to result in a trapping set for the specific conditions in a data processing system containing an LDPC decoder. Thus, the selection of bit or symbol locations in an LDPC code to be include in error injection for retry validation may be performed manually on a case-by-case basis. In other embodiments, automated systems such as software analysis tools may be used to identify trapping sets in an LDPC code, either using full automation or as tools to assist a user to identify trapping sets. In other embodiments, trapping sets in an LDPC code may be identified by trial and error using trial data sets.

Figure 3:
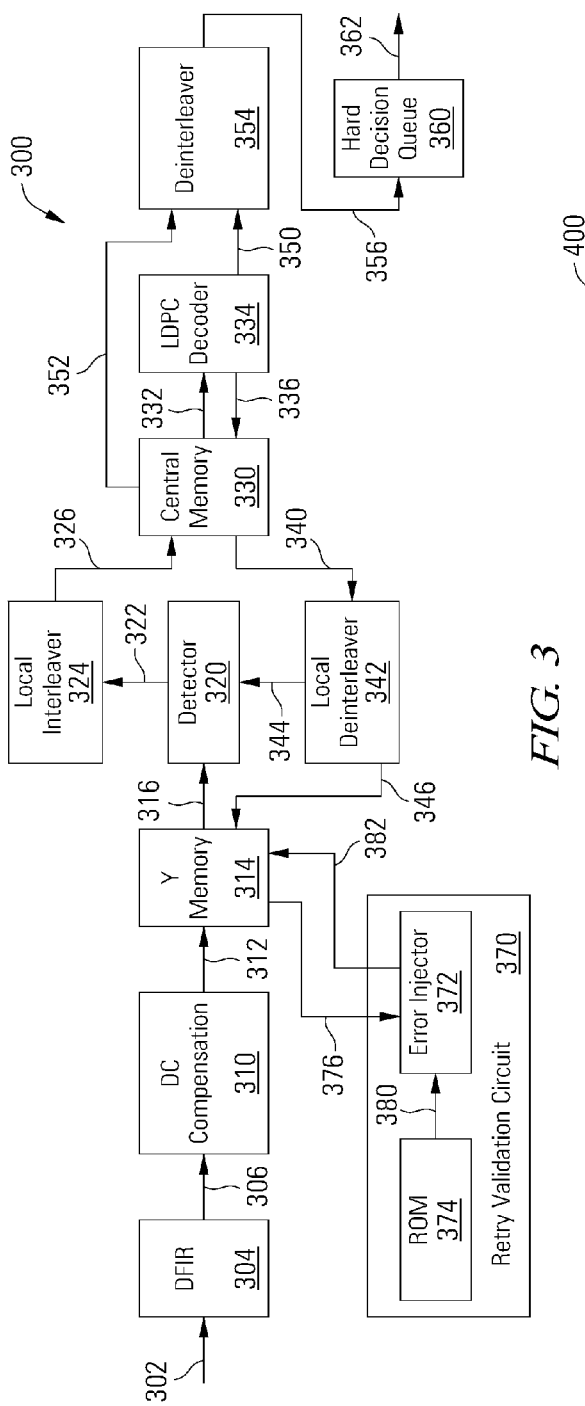
FIG. 3 depicts a data processing circuit with LDPC decoder including error injection for retry validation in accordance with one or more embodiments of the present inventions.

Turning to FIG. 3, a data processing circuit 300 is shown that includes an LDPC decoder 334 with a retry validation circuit 370 to inject errors to test retry features in the LDPC decoder 334 and in the overall data processing circuit 300. Data processing circuit 300 receives digital samples 302 to be processed and decoded in the LDPC decoder 334. Digital samples 302 may be derived from any source of digital data. For example, the data processing circuit 300 may include an analog front end circuit (not shown) that receives an analog signal from a read/write head assembly that is disposed in relation to a storage medium or from a receiver circuit that is operable to receive a signal from a transmission medium. Based upon the disclosure provided herein, one of ordinary skill in the art will recognize a variety of source from which an analog input may be derived. In such embodiments, an analog front end circuit may include, but is not limited to, an analog filter and an amplifier circuit as are known in the art, before providing a processed analog signal to an analog to digital converter circuit (not shown). The analog to digital converter circuit converts the processed analog signal into a corresponding series of digital samples. An analog to digital converter circuit may be any circuit known in the art that is capable of producing digital samples corresponding to an analog input signal. In other embodiments, the digital samples 302 may be obtained directly from a digital storage device or digital transmission medium.

Digital samples 302 are provided to an equalizer circuit 304. Equalizer circuit 304 applies an equalization algorithm to digital samples 302 to yield an equalized output 306. In some embodiments of the present invention, equalizer circuit 304 is a digital finite impulse response filter circuit as are known in the art. The equalized output 306 is provided to a DC compensation circuit 310 that is operable to remove a DC bias or DC component from the equalized output 306 to yield a Y sample 312. The Y sample 312 includes LDPC-encoded digital data bits, equalized to reduce inter-symbol interference (ISI) in the equalizer circuit 304 based on a target response or partial response (PR) target. The Y samples 312 are stored in a Y memory 314 until a data detector circuit 320 is available and ready to begin processing stored Y samples 316.

Data detector circuit 320 is operable to apply a data detection algorithm to a received codeword or data set. In some embodiments of the present inventions, data detector circuit 320 is a Viterbi algorithm data detector circuit as is known in the art. In other embodiments of the present invention, data detector circuit 320 is a maximum a posteriori data detector circuit as is known in the art. Of note, the general phrases "Viterbi data detection algorithm" or "Viterbi algorithm data detector circuit" are used in their broadest sense to mean any Viterbi detection algorithm or Viterbi algorithm detector circuit or variations thereof including, but not limited to, bi-direction Viterbi detection algorithm or bi-direction Viterbi algorithm detector circuit. Also, the general phrases "maximum a posteriori data detection algorithm" or "maximum a posteriori data detector circuit" are used in their broadest sense to mean any maximum a posteriori detection algorithm or detector circuit or variations thereof including, but not limited to, simplified maximum a posteriori data detection algorithm and a max-log maximum a posteriori data detection algorithm, or corresponding detector circuits. Based upon the disclosure provided herein, one of ordinary skill in the art will recognize a variety of data detector circuits that may be used in relation to different embodiments of the present invention. Data detector circuit 320 is started based upon availability of a data set from Y memory 314 or from a central memory circuit 330.

Upon completion, data detector circuit 320 provides detector output 322. Detector output 322 includes soft data. As used herein, the phrase "soft data" is used in its broadest sense to mean reliability data with each instance of the reliability data indicating a likelihood that a corresponding bit position or group of bit positions has been correctly detected. In some embodiments of the present invention, the soft data or reliability data is log likelihood ratio data as is known in the art. Detected output 322 is provided to a local interleaver circuit 324. Local interleaver circuit 324 is operable to shuffle sub-portions (i.e., local chunks) of the data set included as detected output 322 and provides an interleaved codeword 326 that is stored to central memory circuit 330. Interleaver circuit 324 may be any circuit known in the art that is capable of shuffling data sets to yield a re-arranged data set.

Once LDPC decoder 334 is available, a previously stored interleaved codeword 332 is accessed from central memory circuit 330 for decoding. The LDPC decoder 334 used in various embodiments may be any type of LDPC decoder, including binary and non-binary, layered and non-layered. In some embodiments, the LDPC decoder 334 is a non-binary min-sum based LDPC decoder. Based upon the disclosure provided herein, one of ordinary skill in the art will recognize other decode algorithms that may be used in relation to different embodiments of the present invention. The LDPC decoder 334 applies a data decode algorithm to stored interleaved codeword 332 in a variable number of local iterations.

Where the LDPC decoder 334 fails to converge (i.e., fails to yield the originally written data set) and a number of local iterations through LDPC decoder 334 exceeds a threshold, the resulting decoded output may be provided as a decoded output 336 back to central memory circuit 330 where it is stored awaiting another global iteration through data detector circuit 320 and LDPC decoder 334. Once data detector circuit 320 is available, a previously stored decoded output 340 is accessed from central memory circuit 330 and locally deinterleaved by a deinterleaver circuit 342. Deinterleaver circuit 342 rearranges stored decoded output 340 to reverse the shuffling originally performed by interleaver circuit 324. A resulting deinterleaved output 344 is provided to data detector circuit 320 where it is used to guide subsequent detection of a corresponding data set received as stored Y samples 316.

Data that fails to converge in the data processing circuit 300 either during local or global iterations trigger retry features such as, but not limited to, targeted bit or symbol flipping, bit selective scaling (BSS), extrinsic LLR adjusting or parity forcing, dynamic vscaling in a detector, dynamic LDPC scaling/offset, etc. For example, if the number of parity check violations in the LDPC decoder 334 is greater than a lower error threshold but less than an upper error threshold, a particular retry feature such as targeted symbol flipping is invoked, repeating the decoding operation in the LDPC decoder 334 while applying targeted symbol flipping. As another example, if the number of parity check violations in the LDPC decoder 334 is greater than zero but less than the lower error threshold, another retry feature may be invoked, such as dynamic vscaling in the data detector circuit 320. Notably, the number of and type of retry features in the data processing circuit 300 is not limited to those examples disclosed herein. Furthermore, the retry features may be invoked in any suitable manner or based on any suitable trigger conditions in the data processing circuit 300.

Where the decoded output converges (i.e., yields the originally written data set) in the LDPC decoder 334, with or without the assistance of retry features, the resulting decoded output is provided as an output codeword 350 to a deinterleaver circuit 354, along with a stored interleaved codeword 352 from central memory circuit 330. Deinterleaver circuit 354 rearranges the data to reverse the local interleaving applied to the data to yield a deinterleaved output 356. Deinterleaved output 356 is provided to a hard decision queue 360 and thence as a hard decision output 362.

A retry validation circuit 370 reads clean Y samples 376 from the Y memory 314, meaning original equalized data, injects errors that will trigger the retry features in the LDPC decoder 334 or in the data processing circuit 300 overall being tested, yielding biased Y samples 382 that are written back to the Y memory 314 to be processed in data detector circuit 320 and LDPC decoder 334. The retry validation circuit 370 may read clean Y sample 376 and write biased Y sample 382 for an entire codeword corresponding to a data sector from a hard disk drive or other block of data being decoded, or for a component codeword currently being decoded corresponding to a portion of a sector of data, or just the bits or symbols in which errors are injected.

A read-only-memory (ROM) 374 in the retry validation circuit 370 contains the locations or a list of the locations in which errors are to be injected in the clean Y sample 376. The error locations are pre-calculated or pre-determined in some embodiments, and comprise bit or symbol indices for encoded data bits in detector order or in the detector domain, excluding formatting bits. In some embodiments the ROM 374 contains the locations 380 of all of the trapping sets in the LDPC code. In other embodiments the ROM 374 contains the locations of a subset of the trapping sets in the LDPC code. An error injector 372 in the retry validation circuit 370 reads clean Y samples 376 from the Y memory 314, either corresponding to an entire codeword or component codeword, or just the clean Y samples 376 specified by the ROM 374. The error injector 372 changes the values in the clean Y samples 376, introducing errors, to yield the biased Y sample 382. The error injector 372 then writes the biased Y sample 382 back to the Y memory 314, either overwriting the original clean Y samples 376 in Y memory 314 or storing biased Y sample 382 alongside the clean Y samples in Y memory 314. The error injector 372 may write biased Y samples 382 for an entire codeword or component codeword, or just the bits or symbols specified by the ROM 374.

The retry validation circuit 370 injects the appropriate errors, both in location and content, to Y samples in Y memory 314 such that at the end of decoding in the LDPC decoder 334, the error-injected sector will fail with a small error event, that is, with a small enough number of failed parity checks or other error indicators that the desired retry feature will be triggered. The biased Y samples 382 is generated in some embodiments according to Equation 1:

$$Y'=Y+\alpha \cdot (nrz'-nrz)*\text{Target} \qquad (\text{Eq } 1)$$

where Y' are the biased Y samples 376, Y are the clean Y samples 376, α is a scaling factor or biasing level, nrz is the retrieved or transmitted data (e.g., 312), nrz' is the trapping set data or data with injected errors, and Target is the partial response target that is convolved with the data, for example in equalizer circuit 304. In some embodiments, nrz' contains only encoded data, omitting formatting bits, and nrz'−nrz has the length of a data sector.

Notably, in embodiments implementing Equation 1, errors are injected in Y samples, rather than in the detector domain or decoder domain. The detector output 322 and deinterleaved output 344 are in the detector domain, and interleaved codeword 326 and stored decoded output 340 are in the decoder domain. Thus, while trapping sets are identified in the LDPC code in the detector domain, errors to be injected that correspond with the trapping sets are mapped to the Y sample domain, compensating for the data detector circuit 320 between the Y samples and the detector domain, and for the interleaving and deinterleaving performed by local interleaver circuit 324 and deinterleaver circuit 342 between the detector domain and the decoder domain. The Y in Equation 1 are a set of clean Y samples that converge to the stored or transmitted nrz at the channel output or hard decision output (e.g., 362) when no trapping set noise is injected, in other words when α is zero in error injector 372.

In these embodiments implementing Equation 1, nrz and nrz' will differ in only a few locations, i.e., at error injection locations in the decoder domain.

The α is a biasing level in the range from 0 to 1, where 1 is the strongest bias and where 0 disables error injection. The biasing level α is set at a level that will trigger the retry features being validated given errors injected at the trapping set locations. For example, α may be set at a relatively low level to trigger soft error retry features and at a relatively high level to trigger hard error retry features. The particular levels at which α should be set are dependent upon the operating characteristics of the data processing circuit (e.g., 300), the retry features being validated, and the trigger conditions used to initiate the retry features.

The order of operations in Equation 1 can be varied. For example, nrz and nrz' can each be convolved with the partial response target before taking the difference between the results, or the difference between nrz and nrz' can be taken before convolving the result with the partial response target. The biasing level α can be applied either before or after the convolution and difference functions.

If the retry features being validated are working correctly in the LDPC decoder 334 and/or the data processing circuit 300, the hard decision output 362 will be error-free, with the retry features having corrected the injected errors, assuming that the data processing circuit 300 and LDPC decoder 334 are otherwise able to properly decode the clean Y samples. Status indicators from the LDPC decoder 334 may also be used to determine whether the desired retry feature was triggered by the injected errors. For example, the LDPC decoder 334 or the data processing circuit 300 may be operable to indicate if a retry feature is triggered and the type of retry feature that was triggered. If the wrong type of retry feature is triggered, the error locations and/or the biasing level α may be adjusted to properly trigger the retry feature being validated. If the targeted retry feature is triggered but the retry feature is not successful, in other words if the error-injected data does not converge on the correct values with the injected errors having been corrected, the operation of the data processing circuit 300 or LDPC decoder 334 may be adjusted, for example by controlling the number of local and global iterations or by adjusting the trigger conditions to select the retry features in appropriate circumstances so that data converges on correct values. In other embodiments, if retry features fail to correct injected errors, the design of the LDPC decoder 334 or data processing circuit 300 may be adjusted to improve error correction.

Figure 4:
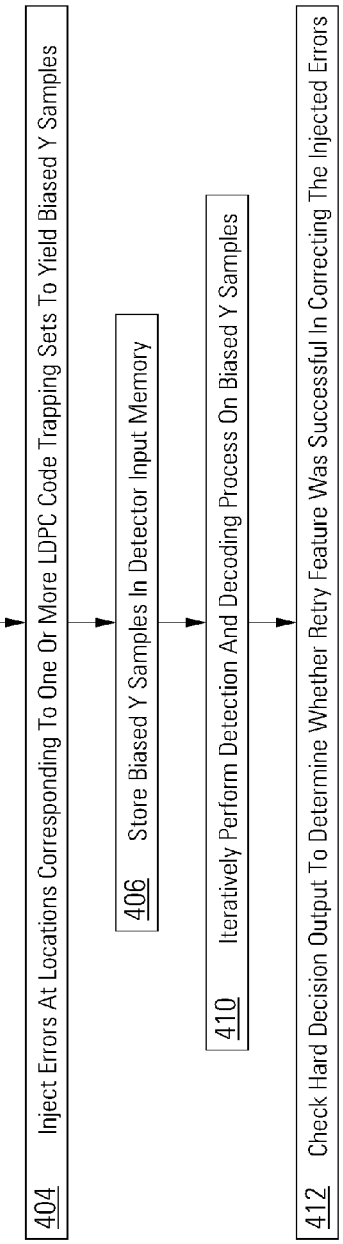
FIG. 4 depicts a flow diagram of an operation for injecting errors for retry validation in a data processing circuit with LDPC decoder in accordance with various embodiments of the present inventions.

Turning to FIG. 4, a flow diagram 400 is depicted of an operation for injecting errors for retry validation in a data processing circuit with a LDPC decoder in accordance with various embodiments of the present inventions. Following flow diagram 400, clean Y samples are obtained. (Block 402) For example, clean Y samples may be read by an error injector 372 from a Y memory 314. Errors are injected at locations corresponding to one or more LDPC code trapping sets to yield biased Y samples. (Block 404) The errors are selected such that the data with injected errors will not normally converge on the correct values in an LDPC decoder without the assistance of the retry feature being validated. The errors may also be mapped across domains in the data processing circuit, for example by convolving with a partial response target and by compensating for interleaving functions in the data processing circuit. The biased Y samples are stored in the input memory to a detector. (Block 406) A detection and decoding process is iteratively performed on the biased Y samples. (Block 410) The Y samples are processed until the data converges or until a predetermined limit on the number of local and/or global iterations has been reached. The hard decision output from the LDPC decoder is checked to determine whether the retry feature was successful in correcting the injected errors. (Block 410) In some embodiments, a status signal or other indicator is also checked to make sure the desired retry feature was triggered, to make sure that the right retry feature was tested by the error injection.

Figure 5:
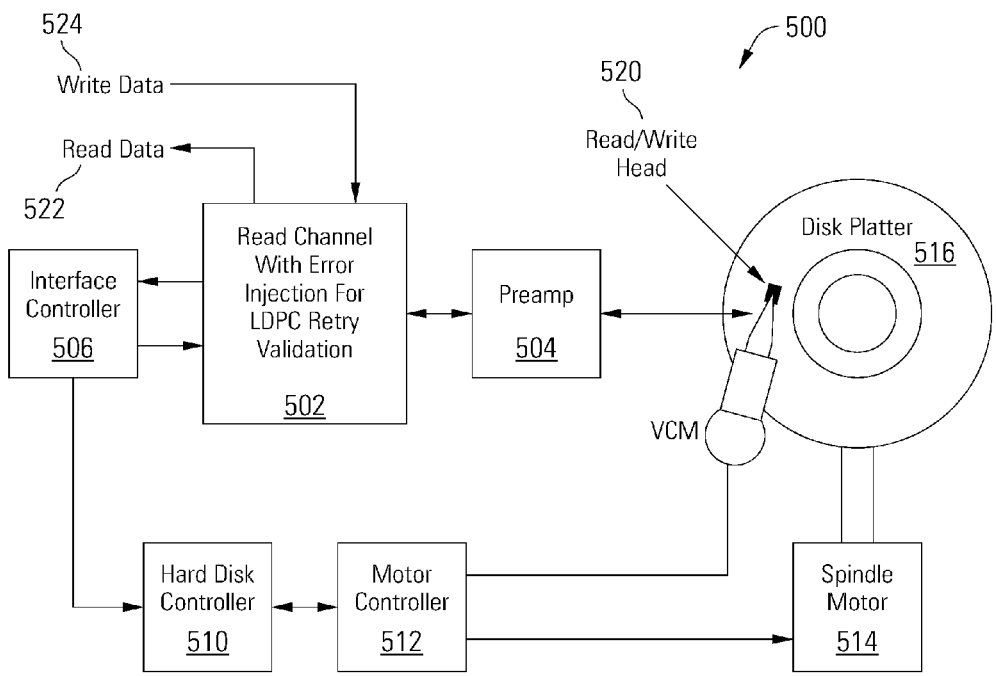
FIG. 5 depicts a storage system including a data processing circuit with LDPC decoder including error injection for retry validation in accordance with various embodiments of the present invention.
Figure 6:
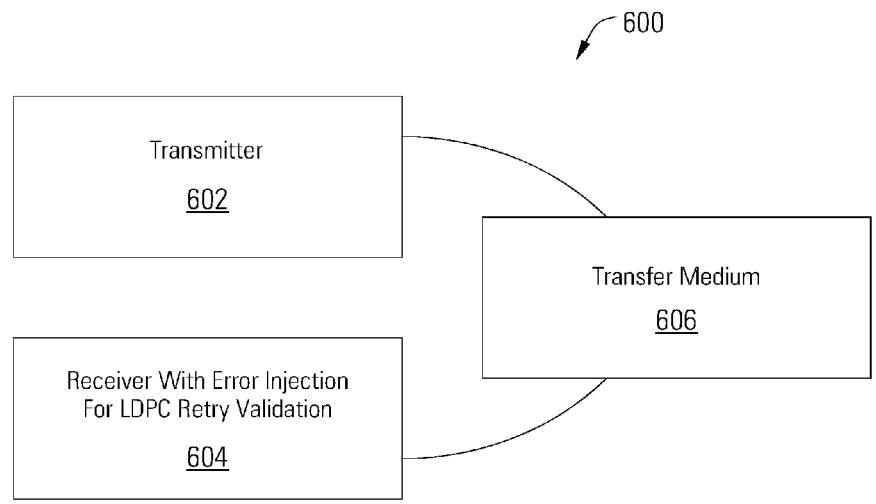
FIG. 6 depicts a wireless communication system including a data processing circuit with LDPC decoder including error injection for retry validation in accordance with various embodiments of the present invention.

Although the error injection for LDPC retry validation disclosed herein is not limited to any particular application, several examples of applications are presented in FIGS. 5 and 6 that benefit from embodiments of the present invention. Turning to FIG. 5, a storage system 500 is illustrated as an example application of error injection for LDPC retry validation in accordance with some embodiments of the present invention. The storage system 500 includes a read channel circuit 502 with error injection for LDPC retry validation in accordance with some embodiments of the present invention. Storage system 500 may be, for example, a hard disk drive. Storage system 500 also includes a preamplifier 504, an interface controller 506, a hard disk controller 510, a motor controller 512, a spindle motor 514, a disk platter 516, and a read/write head assembly 520. Interface controller 506 controls addressing and timing of data to/from disk platter 516. The data on disk platter 516 consists of groups of magnetic signals that may be detected by read/write head assembly 520 when the assembly is properly positioned over disk platter 516. In one embodiment, disk platter 516 includes magnetic signals recorded in accordance with either a longitudinal or a perpendicular recording scheme.

In a typical read operation, read/write head assembly 520 is accurately positioned by motor controller 512 over a desired data track on disk platter 516. Motor controller 512 both positions read/write head assembly 520 in relation to disk platter 516 and drives spindle motor 514 by moving read/write head assembly 520 to the proper data track on disk platter 516 under the direction of hard disk controller 510. Spindle motor 514 spins disk platter 516 at a determined spin rate (RPMs). Once read/write head assembly 520 is positioned adjacent the proper data track, magnetic signals representing data on disk platter 516 are sensed by read/write head assembly 520 as disk platter 516 is rotated by spindle motor 514. The sensed magnetic signals are provided as a continuous, minute analog signal representative of the magnetic data on disk platter 516. This minute analog signal is transferred from read/write head assembly 520 to read channel circuit 502 via preamplifier 504. Preamplifier 504 is operable to amplify the minute analog signals accessed from disk platter 516. In turn, read channel circuit 502 decodes and digitizes the received analog signal to recreate the information originally written to disk platter 516. This data is provided as read data 522 to a receiving circuit. As part of decoding the received information, read channel circuit 502 processes the received signal using an LDPC decoder that includes error injection for LDPC retry validation to test retry features of the LDPC decoder. Such error injection for LDPC retry validation may be implemented consistent with that disclosed above in relation to FIG. 3. In some cases, the error injection for LDPC retry validation may be performed consistent with the flow diagram disclosed above in relation to FIG. 4. A write operation is substantially the opposite of the preceding read operation with write data 524 being provided to read channel circuit 502. This data is then encoded and written to disk platter 516.

It should be noted that storage system 500 may be integrated into a larger storage system such as, for example, a RAID (redundant array of inexpensive disks or redundant array of independent disks) based storage system. Such a RAID storage system increases stability and reliability through redundancy, combining multiple disks as a logical unit. Data may be spread across a number of disks included in the RAID storage system according to a variety of algorithms and accessed by an operating system as if it were a single disk. For example, data may be mirrored to multiple disks in the RAID storage system, or may be sliced and distributed across multiple disks in a number of techniques. If a small number of disks in the RAID storage system fail or become unavailable, error correction techniques may be used to recreate the missing data based on the remaining portions of the data from the other disks in the RAID storage system. The disks in the RAID storage system may be, but are not limited to, individual storage systems such storage system 500, and may be located in close proximity to each other or distributed more widely for increased security. In a write operation, write data is provided to a controller, which stores the write data across the disks, for example by mirroring or by striping the write data. In a read operation, the controller retrieves the data from the disks. The controller then yields the resulting read data as if the RAID storage system were a single disk.

Turning to FIG. 6, a wireless communication system 600 or data transmission device including a receiver 604 with error injection for LDPC retry validation is shown in accordance with some embodiments of the present invention. Communication system 600 includes a transmitter 602 that is operable to transmit encoded information via a transfer medium 606 as is known in the art. The encoded data is received from transfer medium 606 by receiver 604. Receiver 604 uses an LDPC decoder that includes error injection for LDPC retry validation to test retry features of the LDPC decoder. Such error injection for LDPC retry validation may be implemented consistent with that disclosed above in relation to FIG. 3. In some cases, the error injection for LDPC retry validation may be performed consistent with the flow diagram disclosed above in relation to FIG. 4.

It should be noted that the various blocks discussed in the above application may be implemented in integrated circuits along with other functionality. Such integrated circuits may include all of the functions of a given block, system or circuit, or a portion of the functions of the block, system or circuit. Further, elements of the blocks, systems or circuits may be implemented across multiple integrated circuits. Such integrated circuits may be any type of integrated circuit known in the art including, but are not limited to, a monolithic integrated circuit, a flip chip integrated circuit, a multichip module integrated circuit, and/or a mixed signal integrated circuit. It should also be noted that various functions of the blocks, systems or circuits discussed herein may be implemented in either software or firmware. In some such cases, the entire system, block or circuit may be implemented using its software or firmware equivalent. In other cases, the one part of a given system, block or circuit may be implemented in software or firmware, while other parts are implemented in hardware.

In conclusion, the present invention provides novel systems, devices, methods and arrangements for error injection for LDPC retry validation. While detailed descriptions of one or more embodiments of the invention have been given above, various alternatives, modifications, and equivalents will be apparent to those skilled in the art without varying from the spirit of the invention. Therefore, the above description should not be taken as limiting the scope of the invention, which is defined by the appended claims.

What is claimed is:

1. An apparatus comprising:
    a data processing circuit comprising a low density parity check decoder operable to apply a data decode algorithm to correct errors in a data set, wherein the data processing circuit is operable to apply at least one retry feature to correct the errors that are not corrected in the low density parity check decoder by the data decode algorithm; and
    a retry validation circuit operable to inject errors in the data set to trigger the at least one retry feature.

2. The apparatus of claim 1, wherein at least some of the errors that are not corrected in the low density parity check decoder remain uncorrected by the data decode algorithm due to at least one trapping set in a low density parity check code implemented in the low density parity check decoder.

3. The apparatus of claim 1, wherein the retry validation circuit comprises a read only memory operable to store a list of locations in the data set at which the errors are to be injected.

4. The apparatus of claim 1, wherein the retry feature comprises flipping at least one symbol in the data set and reapplying the data decode algorithm in the low density parity check decoder to the data set with the at least one symbol that has been flipped.

5. The apparatus of claim 1, further comprising a detector operable to perform a detection process on the data set yielding likelihood information that bits in the data set have been correctly detected, wherein the data processing circuit is operable to iteratively process the data set with the detector and the low density parity check decoder.

6. The apparatus of claim 5, wherein the detector comprises a Viterbi detector.

7. The apparatus of claim 6, wherein the retry feature comprises scaling of values in the data set as the detection process is performed on the data set by the detector.

8. The apparatus of claim 5, further comprising an interleaver between the detector and the low density parity check decoder, operable to rearrange portions of the data set.

9. The apparatus of claim 5, further comprising a memory operable to store the data set for processing by the detector, wherein the retry validation circuit is operable to inject errors in the data set stored in the memory.

10. The apparatus of claim 9, wherein the data set stored in the memory comprises an equalized data set, the apparatus further comprising an equalizer operable to convolve an input data set with a partial response target to yield the equalized data set.

11. The apparatus of claim 10, wherein the retry validation circuit yields a biased equalized data set with injected errors to be stored in the memory.

12. The apparatus of claim 11, wherein the retry validation circuit is operable to generate the biased equalized data set by adding a difference between the input data set and a copy of the input data set with injected errors, convolved with the partial response target, to the equalized data set.

13. The apparatus of claim 12, wherein the retry validation circuit is operable to scale the difference between the input data set and a copy of the input data set with injected errors, convolved with the partial response target, by a scaling factor to trigger the at least one retry feature.

14. The apparatus of claim 1, wherein the apparatus is implemented as an integrated circuit.

15. The apparatus of claim 1, wherein the apparatus is incorporated in a storage device.

16. The apparatus of claim 15, wherein the storage device comprises a redundant array of independent disks.

17. The apparatus of claim 1, wherein the apparatus is incorporated in a transmission system.

18. A method for injecting errors in a data set to validate a retry feature in a data processing circuit, comprising:
- reading a clean version of the data set;
- injecting errors in the clean version of the data set at locations corresponding to at least one trapping set in a low density parity check code implemented in the data processing circuit to yield a biased version of the data set; and
- iteratively decoding the biased version of the data set to determine whether the retry feature successfully corrected the injected errors, wherein the retry feature is triggered when the biased version of the data set fails to converge in a low density parity check decoder.

19. The method of claim 18, wherein injecting the errors comprises adding a difference between a pre-equalization version of the data set and a copy of the pre-equalization version of the data set with injected errors, convolved with a partial response target, and scaled by a scaling factor, to a post-equalization version of the data set.

20. A storage system comprising:
- a storage medium maintaining a data set;
- a read/write head assembly operable to sense the data set on the storage medium;
- a data processing circuit comprising a low density parity check decoder operable to apply a data decode algorithm to correct errors in the data set, wherein the data processing circuit is operable to apply at least one retry feature to correct the errors in the data set that are not corrected in the low density parity check decoder by the data decode algorithm; and
- a retry validation circuit operable to inject errors in the data set to trigger the at least one retry feature.

* * * * *